(12) United States Patent
Yong et al.

(10) Patent No.: US 9,209,338 B2
(45) Date of Patent: Dec. 8, 2015

(54) OPTICAL DEVICE WITH THROUGH-HOLE CAVITY

(71) Applicants: Lig Yi Yong, Penang (MY); Yean Chon Yaw, Penang (MY)

(72) Inventors: Lig Yi Yong, Penang (MY); Yean Chon Yaw, Penang (MY)

(73) Assignee: Intellectual Discovery Co., Ltd., Seoul (KR)

( * ) Notice: Subject to any disclaimer, the term of this patent is extended or adjusted under 35 U.S.C. 154(b) by 0 days.

(21) Appl. No.: 14/094,389

(22) Filed: Dec. 2, 2013

(65) Prior Publication Data

US 2014/0084309 A1    Mar. 27, 2014

Related U.S. Application Data

(62) Division of application No. 13/188,315, filed on Jul. 21, 2011, now Pat. No. 8,610,159.

(51) Int. Cl.
*H01L 31/147* (2006.01)
*H01L 33/48* (2010.01)
*H01L 25/16* (2006.01)
*H01L 33/54* (2010.01)
*H01L 33/60* (2010.01)

(52) U.S. Cl.
CPC ............ *H01L 31/147* (2013.01); *H01L 33/486* (2013.01); *H01L 25/167* (2013.01); *H01L 33/54* (2013.01); *H01L 33/60* (2013.01); *H01L 2224/48091* (2013.01); *H01L 2224/48247* (2013.01); *H01L 2224/48257* (2013.01)

(58) Field of Classification Search
USPC .............................................. 257/421, 82, 98
See application file for complete search history.

(56) References Cited

U.S. PATENT DOCUMENTS

| 4,309,605 | A | * | 1/1982 | Okabe | 250/239 |
| 5,340,993 | A | * | 8/1994 | Salina et al. | 250/551 |
| 2001/0026011 | A1 | * | 10/2001 | Roberts et al. | 257/678 |
| 2006/0071150 | A1 | * | 4/2006 | Aizpuru | 250/214.1 |
| 2006/0097051 | A1 | * | 5/2006 | Foo et al. | 235/454 |
| 2010/0124794 | A1 | * | 5/2010 | Iwasaki et al. | 438/29 |
| 2012/0104436 | A1 | * | 5/2012 | Ng | H01L 33/58 257/98 |

* cited by examiner

*Primary Examiner* — Zandra Smith
*Assistant Examiner* — Lawrence Tynes, Jr.
(74) *Attorney, Agent, or Firm* — Fox Rothschild LLP

(57) ABSTRACT

A light-emitting device having a through-hole cavity is disclosed. The optical device may contain a plurality of conductors, a light source die, a body and a transparent encapsulant material. The body may have a top surface and a bottom surface. A cavity is formed within the body extending from the bottom surface to the top surface and defining therein a bottom opening and a top opening, respectively. Optionally, the light-emitting device may comprise a lens. During manufacturing process, liquid or semi-liquid form transparent material is injected from the bottom surface into the cavity, encapsulating the light source die and forming a lens. The shape of the lens is defined by a mold aligned to the top opening of the body. In yet another embodiment, optical devices having a cavity or multiple cavities are disclosed. The optical devices may include a proximity sensor, an optocoupler, an encoder and other similar sensors.

19 Claims, 10 Drawing Sheets

US 9,209,338 B2

OPTICAL DEVICE WITH THROUGH-HOLE CAVITY

CROSS REFERENCE TO RELATED PATENT APPLICATION

The present application is a divisional patent application of U.S. patent application Ser. No. 13/188,315 entitled "OPTICAL DEVICE WITH THROUGH-HOLE CAVITY," which was filed on Jul. 21, 2011.

BACKGROUND

A light-emitting diode (referred to hereinafter as LED) represents one of the most popular light-emitting devices today. Due to the high power efficiency and small form factors, LEDs are commonly used not only in light-emitting devices, but also other devices such as flat panel display systems, optical transmitters, optocouplers, electronic sign and display systems, indicator lights, optical encoders and many other similar optical devices. Optical encoders, optocouplers and proximity sensors may also be known as optical sensors. The LED dies are typically less than 1 mm in size. The small size enables integration of an optical lens into the optical devices. For example, many optical devices, such as optical encoders and proximity sensors have integrated lens. Some lighting fixtures may also comprise a lens.

By collimating, focusing and directing light emitted from the LED light source dies in a specific direction the lens may be configured to increase optical efficiency by approximately 3 times when compared to a device without an optical lens. For example, a light source die in an optical encoder may emit light in all directions, but by using appropriate reflectors and lenses, the light may be focused and channeled to the code wheel, and thus, increasing the power efficiency. In addition, the optical lens may be configured to transform the resolution of a code wheel in order to match the spacing of the photodiodes. For example, the light signals reflected from a code wheel may comprise light bars distanced away from each other in a first dimension different from the spacing between photodiodes resolution, which is in a second dimension. However, the resolution of the light bars, after going through a lens, may be altered into the second dimension matching the spacing between photodiodes resolution. As a result, by using a lens, one type of photodiode with a specific dimension may work with many different code wheels having different resolutions.

Optical lenses may be manufactured using epoxies or any other transparent encapsulant materials commonly used to encapsulate the LED light source dies. Generally, an optical lens may be pre-formed and then glued to the optical device. Optionally, the optical lens may be attached to an encapsulant material in a semi-liquid form followed by a curing process. The above-mentioned method is widely used in making optical sensors and devices, such as proximity sensors, optical encoders, light-emitting devices and many other similar devices.

However, the molding process if not done carefully may result in reliability issues such as delamination and trapping of air bubbles at the area near the lens. The encapsulant used to form the lens is made from liquid or semi-liquid form before being cured into solid form. As the encapsulant is used to fill up a cavity or a reflector cup commonly used in a light-emitting device, air bubbles might be trapped inside the device. In the case where the lens is attached utilizing glue, the lens may be detached when exposed to heat, because different materials in the lens and the body may have different thermal expansion and contraction properties. In addition, a thin layer of air may be trapped in the gluing process and thus deteriorate the optical property of the devices.

BRIEF DESCRIPTION OF THE DRAWINGS

Illustrative embodiments by way of examples, not by way of limitation, are illustrated in the drawings. Throughout the description and drawings, similar reference numbers may be used to identify similar elements.

DETAILED DESCRIPTION

Figure 1:
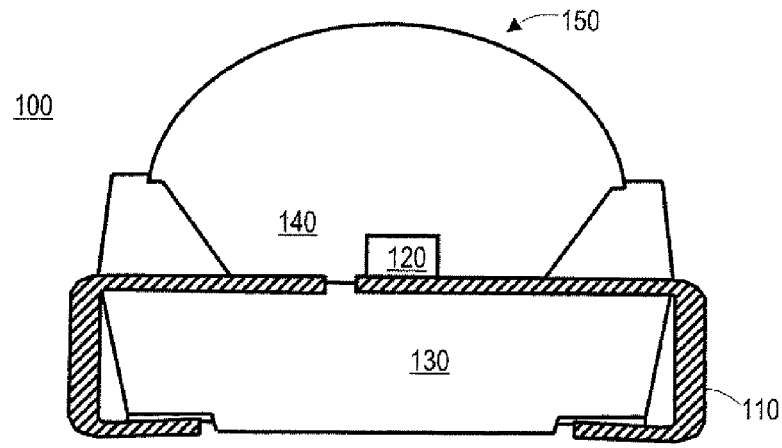
FIG. 1 illustrates a cross-sectional view of a light-emitting device having a lens.

FIG. 1 illustrates a cross-sectional view of a light-emitting device 100. The optical device 100 comprises a plurality of conductors 110, a light source die 120, a body 130 formed by an opaque encapsulant encapsulating at least a portion of the conductors 110, a transparent encapsulant 140 and a lens 150. The transparent encapsulant 140 is configured to encapsulate the light source die 120. The transparent encapsulant 140 may be made from an epoxy material, a silicone material or any other similar material that is transparent.

The transparent encapsulant 140 may be mixed with a wavelength-converting material, such as yellow phosphor. For example, in yet another embodiment, the light-emitting device 100 may further comprise yellow phosphor and the transparent encapsulant 140 may appear yellowish in color rather than clear. The light source die 120 may be a blue LED. Light emitted from the light source die 120 may be blue in color, but be converted into white light when the light is transmitted therein through transparent encapsulant 140 containing a yellow phosphor.

The lens 150 may be a portion of the transparent encapsulant 140. The lens 150 may be molded together with other portions of the transparent encapsulant 140. The shape of the lens 150 may typically be defined by a mold, but as the transparent encapsulant 140 is being configured to fill up the space surrounding the light source die 120, forming the lens 150 in a single step molding process without air bubble being trapped inside the mold may prove to be challenging. Moreover, the light source die 120 may be attached in a reflector cup, which has a shape that may tend to trap air. One effective way to form the lens 150 through a single step molding process is to use a through-hole cavity shown in FIGS. 2A-2G disclosed hereinafter.

Figure 2A:
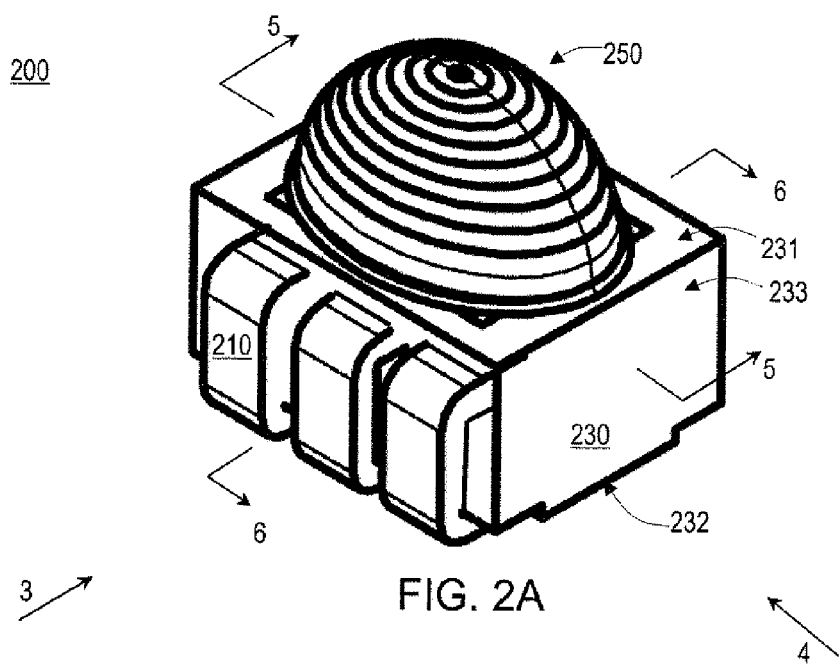
FIG. 2A illustrates a top perspective view of a light-emitting device with a through-hole cavity.
Figure 2B:
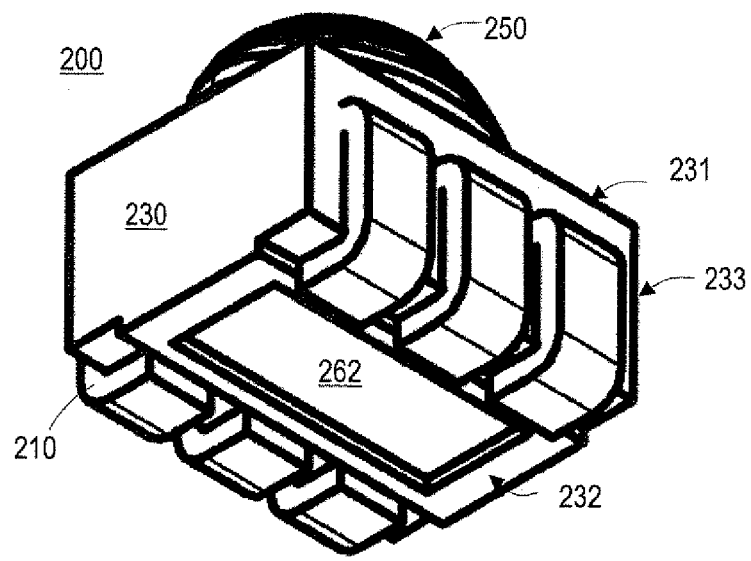
FIG. 2B illustrates a bottom perspective view of the light-emitting device shown in FIG. 2A.
Figure 2C:
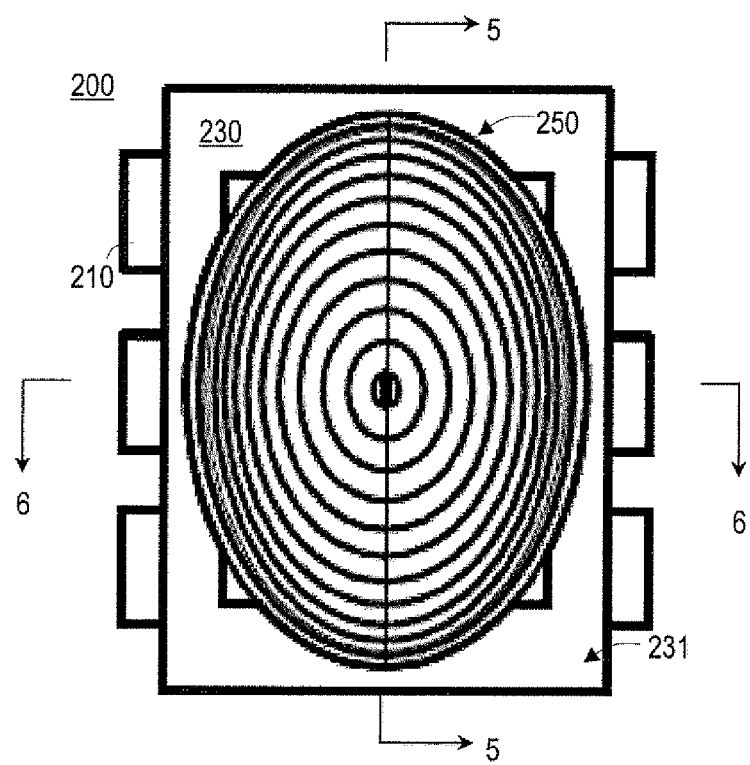
FIG. 2C illustrates a top view of the light-emitting device shown in FIG.
Figure 2D:
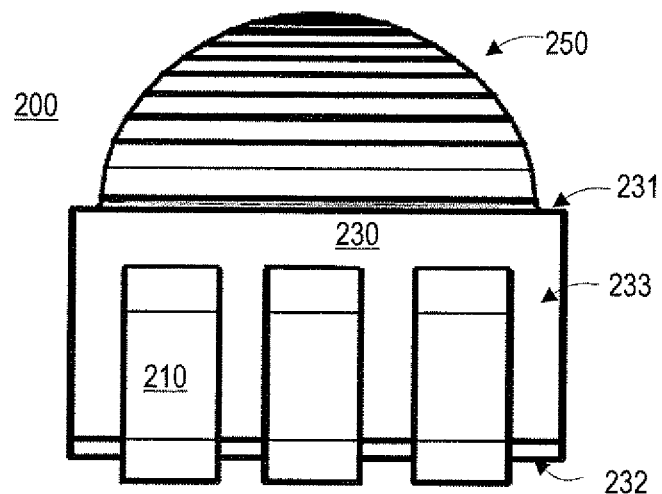
FIG. 2D illustrates a side view of the light-emitting device shown in FIG. 2A taken from the direction 3.
Figure 2E:
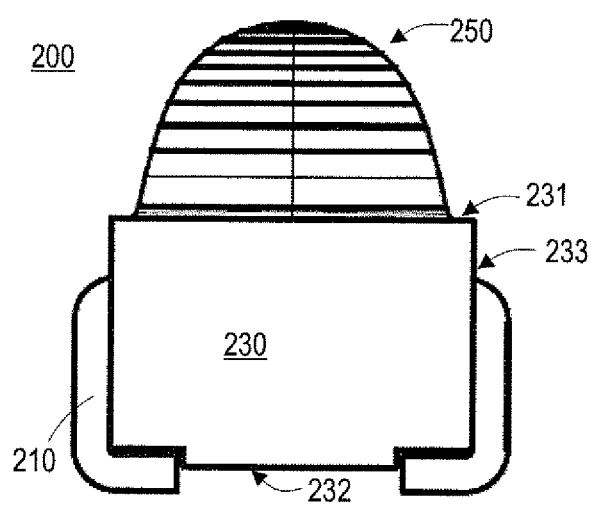
FIG. 2E illustrates a side view of the light-emitting device shown in FIG. 2A taken from the direction 4.
Figure 2F:
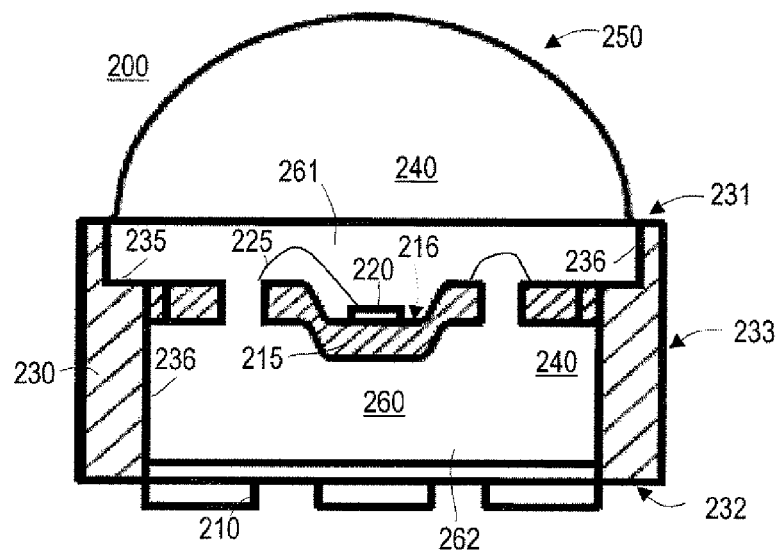
FIG. 2F illustrates a cross-sectional view of the light-emitting device shown in FIG. 2A taken along line 5-5.
Figure 2G:
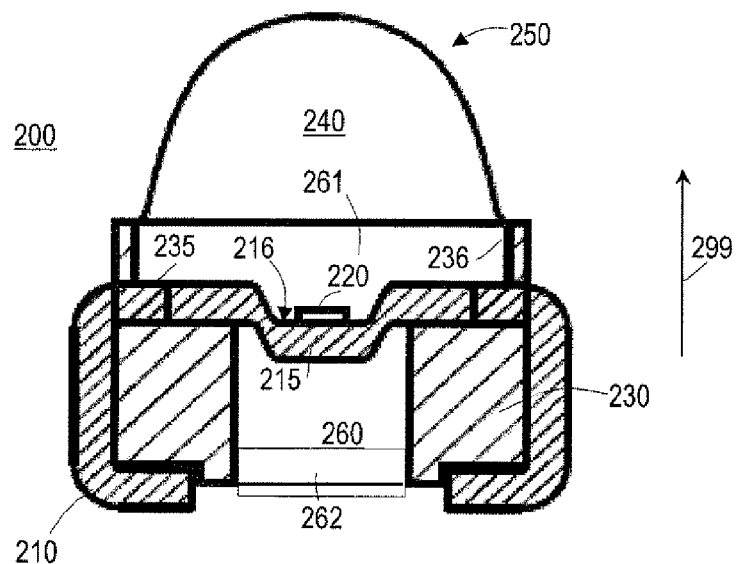
FIG. 2G illustrates a cross-sectional view of the light-emitting device shown in FIG. 2A taken along line 6-6.

FIGS. 2A-2G illustrate a light-emitting device 200 having a through-hole cavity 260 for making a lens 250. More specifically, FIG. 2A illustrates a perspective view of a light-emitting device 200 with a through-hole cavity 260 showing a top portion 231; FIG. 2B illustrates another perspective view of the light-emitting device 200 shown in FIG. 2A showing a bottom surface 232; FIG. 2C illustrates a top view of the light-emitting device 200 shown in FIG. 2A; FIG. 2D illustrates a side view of the light-emitting device 200 shown in FIG. 2A taken from the direction 3; FIG. 2E illustrates another side view of the light-emitting device 200 shown in FIG. 2A taken from the direction 4; FIG. 2F illustrates a cross-sectional view of the light-emitting device 200 shown in FIG. 2A taken along line 5-5; and FIG. 2G illustrates a cross-sectional view of the light-emitting device 200 shown in FIG. 2A taken along line 6-6.

Referring to the embodiment shown in FIGS. 2A-2G, the light-emitting device 200 may comprise a plurality of conductors 210, a die attach area 215, a light IS source die 220, a body 230, a transparent encapsulant 240 and a lens 250. The light source die 220 may be a semiconductor die configured to emit light. A portion of one of the plurality of conductors 210 may define the die attach area 215. The die attach area 215 may define a cup shape having a horizontal flat planar surface 216 for directing light toward the top of the light-emitting device 200, as shown by direction arrow 299 (See FIG. 2G). The light source die 220 may be attached on the horizontal flat planar surface 216 of the die attach area 215. In yet another embodiment, the die attach area 215 may comprise only the horizontal flat planar surface 216 without the cup shape. The conductors 210 may be leads configured to electrically connect the light source die 220 to an external power source (not shown). Generally, a portion of each of the plurality of conductors 210 may be bent and exposed at the bottom portion of the body 230 for soldering and connecting to an external substrate (not shown), such as a printed circuit board (PCB) or a flexible board. The light-emitting device 200 may also comprise more than one light source die 230. In yet another embodiment, the light-emitting device 200 may comprise a light receiver die (not shown) or a non-optical integrated circuit die (not shown).

The body 230 may be formed of an opaque encapsulant encapsulating at least a portion of the conductors 210. The body 230 may be made from ceramic, plastic, or another other similar material. Alternatively, the body 230 may be made of a highly reflective material such as poly-phthalamide, which is also known as PPA, liquid crystal polymer, which is known as LCP, or any other similar material. In the embodiment shown in FIGS. 2F and 2G, the body 230 comprises a top surface 231, a bottom surface 232 and at least a side surface 233. The body 230 may define a cavity 260 extending from the bottom surface 232 to the top surface 231 of the body 230 and defining therein, an opening 261 at the top surface 231 and another opening 262 at the bottom surface 232. Generally, the opening 261 may be co-axially aligned to the lens 250. The rectangular shape body 230 shown in FIGS. 2A-2G comprises four side surfaces 233. However, a light-emitting device 200 in yet another embodiment where the body 230 defines a cylindrical shape may comprise only one side surface 233.

Referring to FIGS. 2F and 2G, the body 230 may define a flange portion 235 and at least a sidewall 236. The flange portion 235 may provide more area for light to be reflected and also double function as a mechanical interlock for the transparent encapsulant 240. The die attach area 215 may define a cup shape. The horizontal flat planar surface 216, the flange portion 235, and the internal wall 236 may function as reflectors configured to reflect and redirect light in a desired direction. For example, the sidewall 236, the flange 235, the die attach area 215 and the horizontal flat planar surface 216, shown in the embodiment illustrated in FIGS. 2A-2G are configured to direct light towards the top of the light-emitting device 200, shown by direction arrow 299. The optical performance of the light-emitting device 200 coupled with the lens 250 may be simulated and determined through optics simulation tools such as ASAP from Breault Research, TracePro from Lambda Research, FRED from Photon Engineering, or any other similar tools.

The transparent encapsulant 240 is formed within the cavity 260 and a portion of the transparent encapsulant 240 extends above and over the body 230 thereby defining the lens 250. The transparent encapsulant 240 may be silicone, epoxy, or any other similar material. The transparent encapsulant 240 may be in liquid or semi-liquid form, which is injected into the cavity 260 during initial phase of manufacturing process through the opening 262 located at the bottom surface 232. In a subsequent step of the manufacturing process, the liquid or semi-liquid form transparent encapsulant 240 may be then cured into a solid form. This implies that one function of the cavity 260 is to accommodate the injection of the liquid form transparent encapsulant 240. Generally, the cavity 260 extends in a substantially vertical manner from the bottom surface 232 to the top surface 231 of the body 230. However, the cavity 260 may extend diagonally from the bottom surface 232 to the top surface 231 at an angle (not shown) less than 60 degree from the vertical axis.

The transparent encapsulant 240 may be mixed with a wavelength converting material. For example, in yet another embodiment, the transparent encapsulant 240 may be mixed with yellow phosphor, configured to convert a blue light to obtain visible white light. In that case where a yellow phosphor is used, the transparent encapsulant 240 may appear yellowish and not completely clear. However, light emitted from the light source die 220 may be emitted through the transparent encapsulant 240 without material losses.

In the embodiment shown in FIGS. 2A-2G, the lens 250 may be an integral part of the transparent encapsulant 240. This may be highly convenient as the lens 250 and the transparent encapsulant 240 may be made in one single process step, thus reducing manufacturing cost and time. Alternatively, the lens 250 may be glued or attached to the transparent encapsulant 240. Obviously, the additional process of gluing or attaching the lens 250 is not desirable. In addition, the multiple step manufacturing process may be disadvantageous as a thin layer of air may be trapped and affect optical performance of the light-emitting device 200.

As shown in FIGS. 2F and 2G, the lens 250 may be coaxially fitting onto the flange 235. The lens 250 may have a diameter larger than the cavity 260. With such a configuration, a mechanical interlock between the transparent encapsulant 240 and the body 230 may be achieved. In yet another embodiment, the opening 262 at the bottom surface 232 may be configured to be larger than the cavity 240 such that similar mechanical interlock mechanism can be achieved. The mechanical interlock mechanisms discussed above may be optional and may be implemented individually or in any combination.

Figure 3:
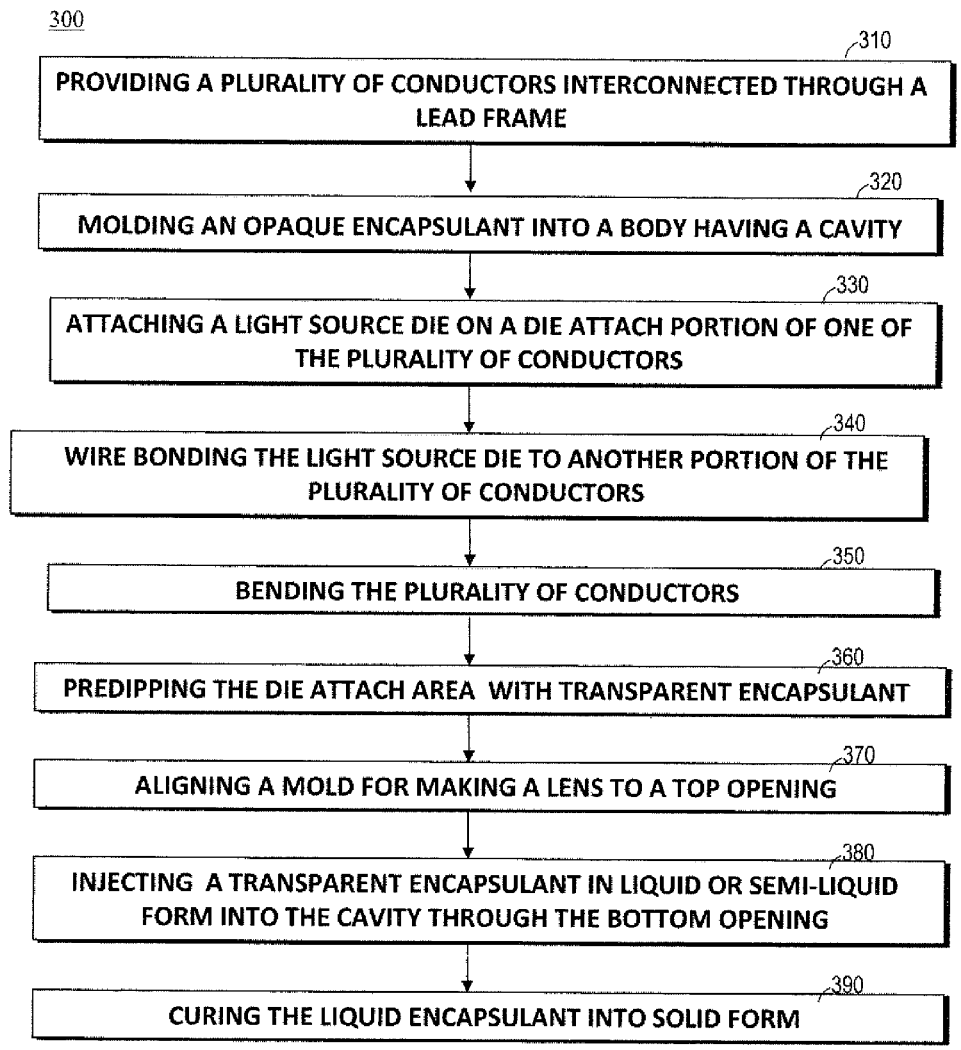
FIG. 3 shows a flow chart of a method for making a light-emitting device shown in FIG. 2A.
Figure 4A:
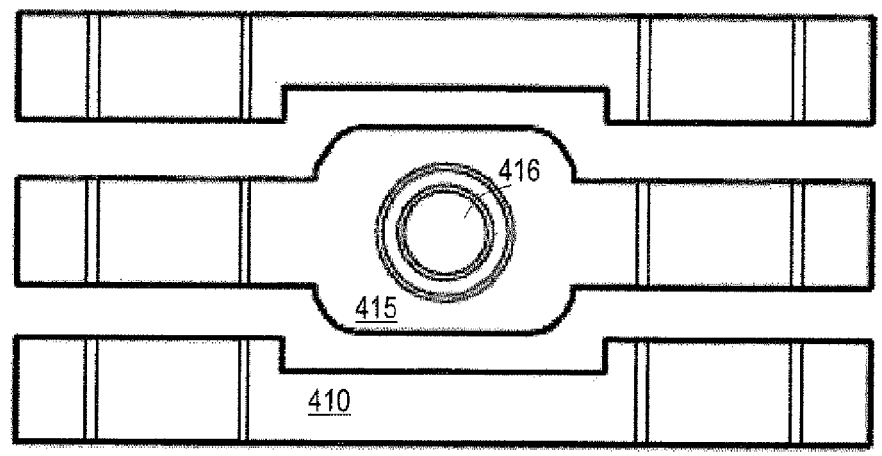
FIG. 4A illustrates a lead frame of a light-emitting device during fabrication process.

FIG. 3 and FIGS. 4A-4E illustrates how the light-emitting device 200 shown in FIGS. 2A-2G may be manufactured. More specifically, FIG. 3 illustrates a flow chart for a method 300 of fabricating the light-emitting device 200 shown in FIGS. 2A-2G. Whereas FIGS. 4A-4E show the light-emitting device 200 during various stages of manufacturing. Referring to FIG. 3 and FIG. 4A, in step 310, a plurality of conductors 410 are provided. The plurality of conductors 410 may be interconnected through a lead frame (not shown) that holds all the plurality of conductors 410 during the manufacturing process. One of the conductors 410 may define a die attach area 415. A portion of the die attach area 415 may be bent to define a horizontal flat planar surface 416.

Figure 4B:
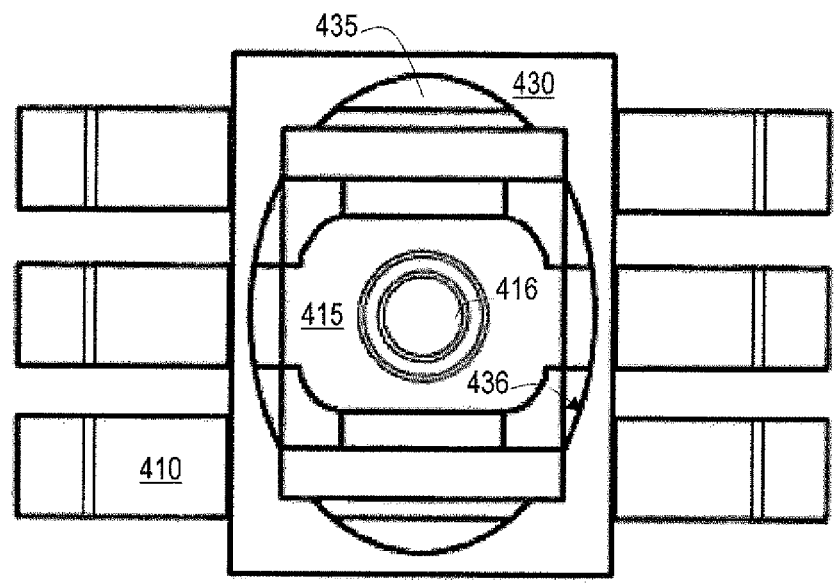
FIG. 4B illustrates a lead frame of a light-emitting device after a molding process.
Figure 4C:
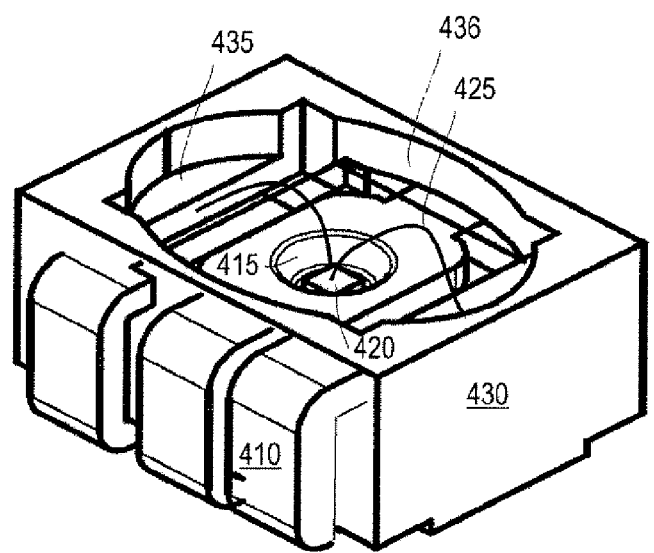
FIG. 4C illustrates a semi-finished light-emitting device after a die attach process.

As shown in FIG. 3 and FIG. 4B, in step 320, a body 430 may be formed. The body 430 may be formed by means of a molding process. The body 430 may encapsulate a portion of each of the plurality of conductors 410. The body 430 may define a flange 435 and an inner wall 436. Referring to FIG. 3 and FIG. 4C, a light source die 420 may be attached to the die attach area 415 in step 330. The method 300 then proceeds to step 340 in which the light source die 420 is wire bonded to one or more of the respective plurality of conductors 410 followed by step 350, in which the plurality of conductors 410 are bent. FIG. 4C illustrates the semi-finished light-emitting device after step 350. Step 340 may be optional. In another embodiment in which the light source die 420 is a flip chip, instead of wire bond 425, electrical connection may be established by attaching the light source die 420 onto different portions of the plurality of conductors 420.

Figure 4D:
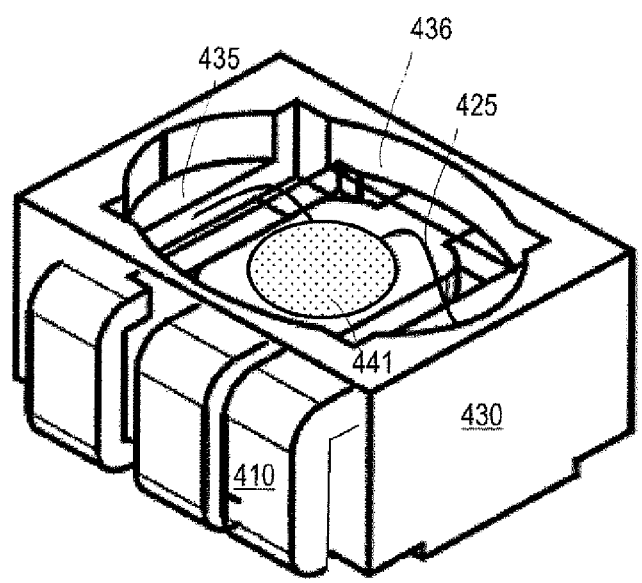
FIG. 4D illustrates a semi-finished light-emitting device after a pre-filled process.
Figure 4E:
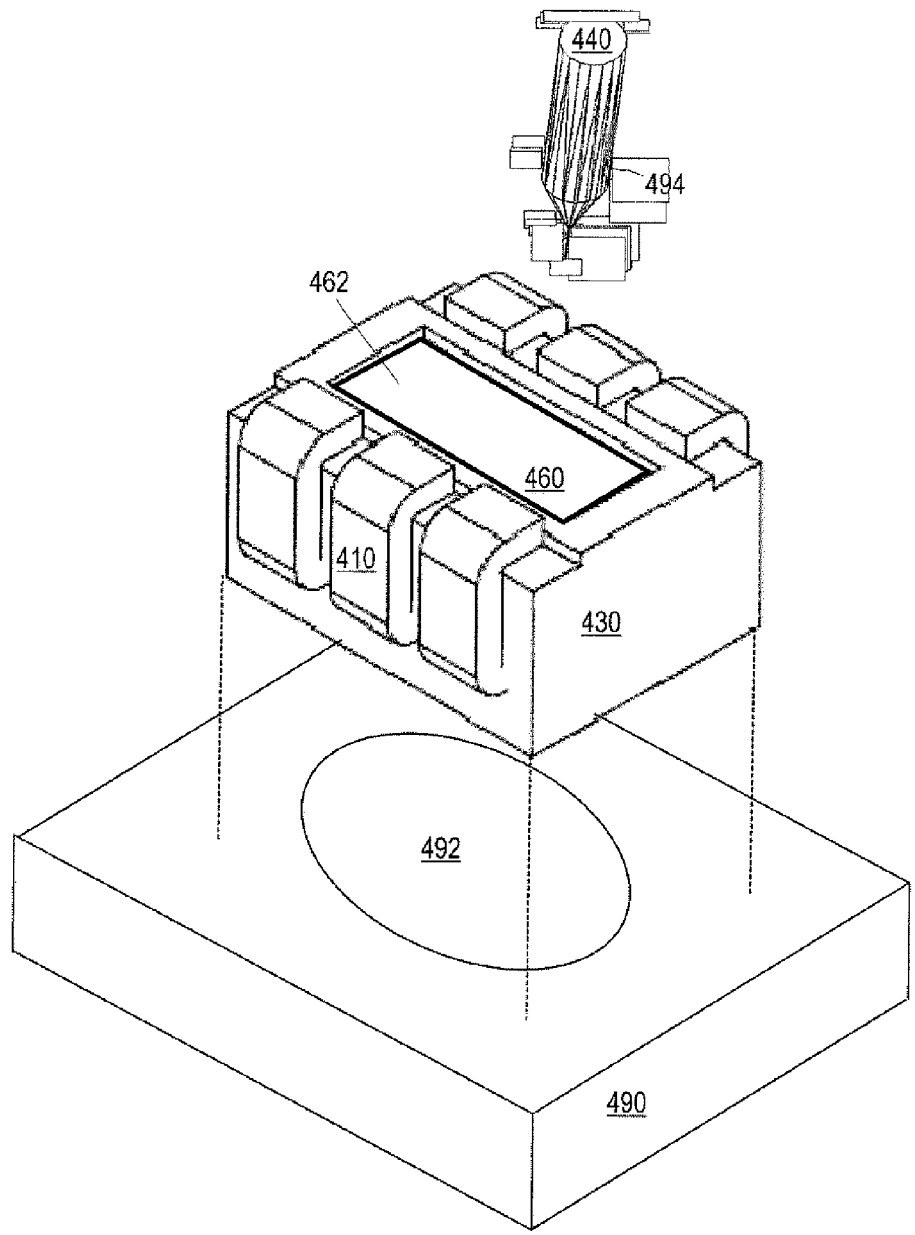
FIG. 4E illustrates how an optical lens is fabricated using the through hole cavity and a mold.

The die attach area 415 may be sufficiently large to entrap air forming air pocket near the die attach area 415. In order to ensure that the entire light source die 420 and the die attach area 415 are completely covered and filled up with transparent encapsulant 240 (See FIG. 2G), the relevant area including the die attach area 415, the horizontal flat planar surface 416 and the light source die 420 may go through a pre-dip process illustrated in step 360 in which a clear encapsulant 441 is applied thereon as shown in FIG. 4D. In step 370, the semi-finished light-emitting device may be turned around and aligned with an external mold 490. The mold 490 may comprise a lens molding area 492. As shown in FIG. 3 and FIG. 4E, the position of the semi-finished light-emitting device may be adjusted such that the cavity 460 and the lens molding area 492 are co-axially aligned. This is followed by step 380 in which a transparent encapsulant 440 in liquid form within a dispenser 494 may be injected through the bottom opening 462 of the cavity 460. Finally the transparent encapsulant 240 (see FIG. 2G) is cured into solid form in step 390 and the lead (not shown) may be discarded to yield each individual light-emitting device 200, as shown in FIGS. 2A-2G.

The sequence of manufacturing steps 310-390 shown in FIG. 3 may be altered by a person having ordinary skill in the art without deviating from the spirit of the invention. For example the light source die 420 may be attached to the conductors 410 prior to formation of the body 430. In yet another embodiment, the plurality of conductors 410 may be bend after forming and/or after the curing the transparent encapsulant 440 into solid form. The method 300 shown in FIG. 3 may comprise additional steps. For example, the transparent encapsulant 440 may be degassed prior to step 360. In yet another embodiment, the transparent encapsulant may be mixed with a wavelength converting material, such as phosphor, prior to step 360.

Figure 5:
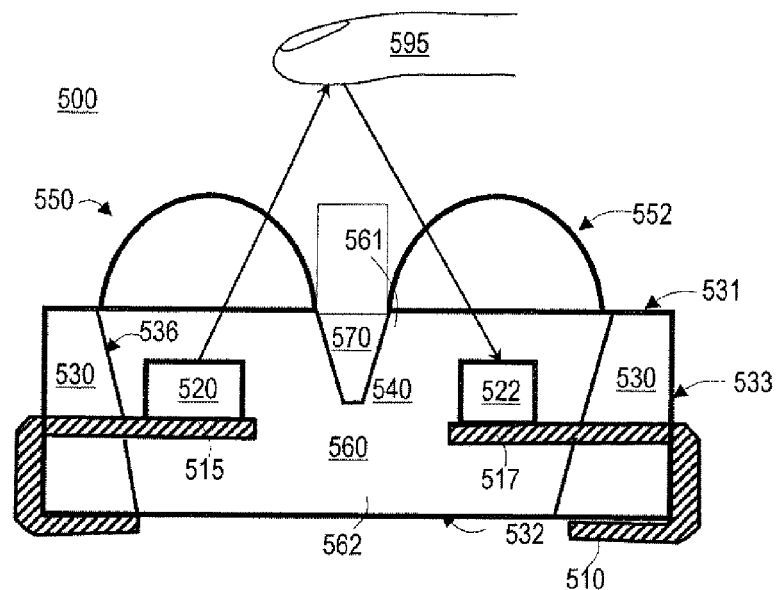
FIG. 5 illustrates a cross-sectional view of a proximity sensor with a through hole cavity.

FIG. 5 illustrates a cross-sectional view of a proximity sensor 500. The proximity sensor 500 may typically be used to detect existence of an external object 595. The proximity sensor 500 may comprise a plurality of conductors 510, at least one die attach area 515, a light source die 520, a receiver die 522, a body 530, a transparent encapsulant 540 and at least a lens 550. The die attach area 515 may be defined by a portion of one of the plurality of conductors 510. In the embodiment shown in FIG. 5, in addition to the first die attach area 515, the proximity sensor 500 comprises a second die attach area 517. The receiver die 522 may be attached on the second die attach area 517. The first and second die attach areas, 515 and 517, respectively, may be defined by two different conductors 510. In another embodiment, the first 515 and the second die attach area 517 may be defined by the same conductor 510. In yet another embodiment, both the light source die 510 and the receiver die 522 may be attached to only one die attach area 515.

The conductors 510 may be a lead frame configured to electrically connect the light source die 520 to an external power source (not shown). The light source die 520 may be configured to emit light toward an external object 595. The light emitted by the light source die 520 may be focused on a specific area or direction towards the external object 595. If the external object 595 were present, light will be reflected from it towards the receiver die 522. A portion of the transparent encapsulant 540 may extend over and above the body 530 to define the lens 550 located in the optical path between the light source die 520 and the external object 595. Another portion of the transparent encapsulant 540 may define a second lens 552 located in the optical path between the external object 595 and the receiver die 522. Without the external object 595, light may not be reflected onto the receiver die 522, and accordingly, the presence of the object 595 will not be detected.

The transparent encapsulant 540 may further define an optional optical barrier 570 located between the light source die 520 and the receiver die 522, such that light may be prevented from being transmitted from the light source die to the receiver die 522 without being reflected by the external object 595. For example, in the embodiment shown in FIG. 5, the optional optical barrier 570 may be a void portion of the transparent encapsulant 540, such that light falling on the optional optical barrier 570 may be reflected under total internal reflection. In yet another embodiment, an opaque material may fill part or all of the void area defining the optional optical barrier 570.

The body 530 may optionally comprise an internal wall 536 configured or coated to reflect light. The body 530 may be made from highly reflective material such as PPA, LCP or any other similar materials. The body 530 comprises a top surface 531, a bottom surface 532, and at least one side surface 533. The body 530 may define a cavity 560 extending from the bottom surface 532 to the top surface 531 of the body 530 and defining therein, a top opening 561 at the top surface 531 and another opening 562 at the bottom surface 532. The top opening 561 may be larger than the bottom opening 562. The cavity 560 extends vertically from the bottom opening 562 to the top opening 561. The transparent encapsulant 540 may be injected into the cavity 560 in liquid or semi-liquid form, encapsulating the die attach area 515, the light source die 520 and the receiver die 522 during an initial phase of manufacturing process. The liquid form transparent encapsulant 540 is then cured into a solid form in subsequent steps of the manufacturing process. Two portions of the transparent encapsulant 540 may extend over and above the body 530 defining the lens 550 and the second lens 552, respectively.

Figure 6:
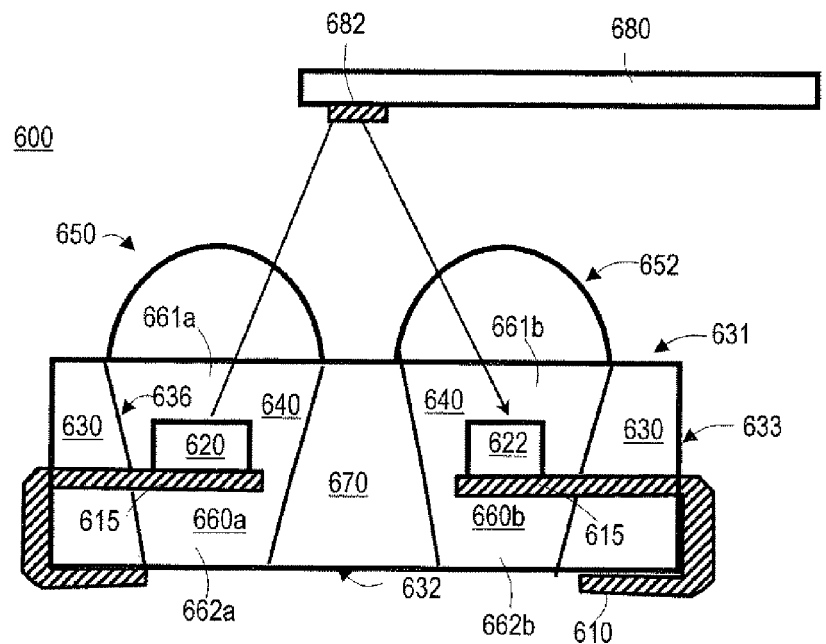
FIG. 6 illustrates a cross-sectional view of an optical encoder having dual through hole cavities.

FIG. 6 illustrates a cross-sectional view of an optical encoder 600. The optical encoder 600 may be utilized to detect and/or measure relative movement of a code wheel 680. The optical encoder 600 may comprise a plurality of conductors 610, two die attach area 615, a light source die 620, a receiver die 622, a body 630, a transparent encapsulant 640, a first lens 650 optically coupled to the light source die 620, a second lens optically coupled to the receiver die 622, and a code wheel 680. The code wheel 680 may be a disc or a linear strip having one or more reflectors 682 arranged in a manner corresponding to a spatial filter.

The body 630 comprises a top surface 631, a bottom surface 632, and at least one side surface 633. The body 630 may define two cavities 660a and 660b. Each of the cavities 660a-660b may extend from the bottom surface 632 to the top surface 631 of the body 630 and defining therein, top openings 661a and 661b, respectively, at the top surface 631 and bottom openings 662a and 662b, respectively, at the bottom surface 632. Each of the cavities 660a-660b extends in a substantially vertical manner from the bottom openings 662a-662b to the top openings 661a-661b, respectively. The transparent encapsulant 640 may be injected into the cavities 660a-660b, respectively, in liquid or semi-liquid form during manufacturing process, as discussed previously. In the cavity 660a, the transparent encapsulant 640 encapsulates the light source die 620. In the cavity 660b, the transparent encapsulant 640 encapsulates the receiver die 622. The transparent encapsulant 640 may extend over and above the body 630 defining the first lens 650 and the second lens 652, respectively. In yet another embodiment, the two cavities 660a and 669b may be interconnected.

Although both the cavities 660a and 660b shown in FIG. 6 extend in a substantially vertical manner, in yet another embodiment, the cavity 660a and 660b may extend at different angles to accommodate the direction of light emission. Each cavity 660a-660b may define a reflective inner wall 636, configured to reflect light. In the embodiment shown in FIG. 6, the center portion of the body 630 may define an optical barrier 670 configured to prevent light from being transmitted directly from the light source die 620 onto the receiver die 622. In yet another embodiment, the optical encoder 600 may only comprise a single cavity (not shown) similar to the cavity 560 shown in FIG. 5.

Figure 7:
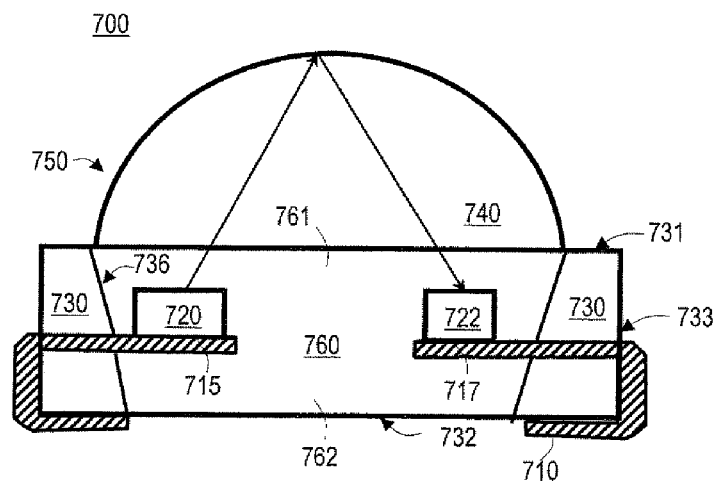
FIG. 7 illustrates a cross-sectional view of an opto-coupler with a through hole cavity.

FIG. 7 illustrates a cross-sectional view of an opto-coupler 700. An optocoupler 700 is a semiconductor device that permits signals to be transferred between two different circuits or systems, while keeping those circuits or systems electrically isolated from each other. Opto-coupler 700 may be used in a wide variety of communications, control, and monitoring systems. The opto-coupler 700 may comprise a plurality of conductors 710, at least one die attach area 715, a light source die 720, a receiver die 722, a body 730, a transparent encapsulant 740 and at least one dome 750. In the embodiment shown in FIG. 7, in addition to the first die attach area 715, the opto-coupler 700 may comprise a second die attach area 717 to accommodate the receiver die 522. In another embodiment, the first and the second die attach areas 715 and 717, respectively, may be defined by the same conductor 710. In yet another embodiment, both the light source die 720 and the receiver die 722 may be attached to only one die attach area 715.

The body 730 comprises an internal wall 736 configured to reflect light. The body 730 comprises a top surface 731, a bottom surface 732, and at least one side surface 733. The body 730 may define a cavity 760 extending from the bottom surface 732 to the top surface 731 of the body 730 in a substantially vertical manner and defining therein, a top opening 761 at the top surface 731 and a bottom opening 762 at the bottom surface 732. The transparent encapsulant 740 may be injected into the cavity 760 in liquid or semi-liquid form, encapsulating the die attach area 715, the light source die 720 and the receiver die 722 before being cured into a solid form during the manufacturing process, as discussed with respect to the previous embodiment. A portion of the transparent encapsulant 740 may extend over and above the body 730, defining the dome 750.

During operation, the light source die 720 may be configured to emit light. The inner reflective wall 736 and the die attach area 715 may be configured to direct light such that a substantial portion of light will be reflected or redirected onto the receiver die 722. The light source die 720 may be configured to be connected to a first external power supply (not shown). However, the receiver die 722 may be configured to be connected to a second external power supply (not shown). The first and second power supplies (not shown) are not electrically connected or coupled. Generally, the first and second power supplies may be voltage source having different voltage outputs. For example, the first power supply (not shown) may be a 100V power source and the second power source (not shown) may be a 10V power source. In order to transmit a signal from electrical devices (not shown) connected to the first power supply (not shown) to electrical devices (not shown) connected to the second external power supply (not shown), the signal, which is first converted into light using the light source die 720 is then reflected through the dome 750 and received in the receiver die 722.

Figure 8:
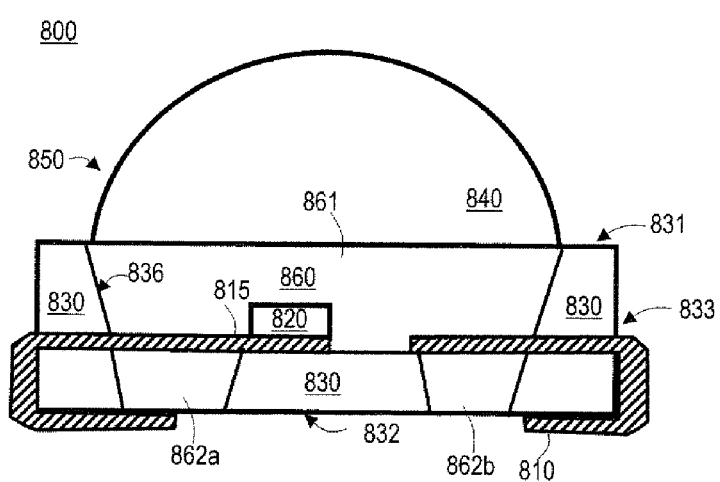
FIG. 8 illustrates a cross-sectional view of a light-emitting device with a through-hole cavity having multiple openings.

FIG. 8 illustrates a cross-sectional view of an alternative light-emitting device 800 with a through-hole cavity 860 having multiple bottom openings 862a-862b. The light-emitting device 800 may be configured to emit light. The light-emitting device 800 may comprise a plurality of conductors 810, at least one die attach area 815, a light source die 820, a body 830, a transparent encapsulant 840 and at least one lens 850. The body 830 comprises an internal wall 836 configured to reflect light. The body 830 comprises a top surface 831, a bottom surface 832, and at least one side surface 833. The body 830 may define a cavity 860 extending from the bottom surface 832 to the top surface 831 of the body 830 and defining therein, a top opening 861 at the top surface 831 and two bottom openings 862a-862b at the bottom surface 832.

The transparent encapsulant 840 may be injected into the cavity 860 in liquid or semi-liquid form through one or both of the bottom openings 862a-862b, encapsulating the die attach area 815 and the light source die 820 before being cured into solid form. During injection of the liquid form transparent encapsulant 840, the other one of the bottom openings 862a-862b may operate as an air escape route preventing air from being trap in the mold. A portion of the transparent encapsulant 740 may extend over and above the body 830 defining the lens 850.

Although specific embodiments of the invention have been described and illustrated herein above, the invention should not be limited to any specific forms or arrangements of parts so described and illustrated. For example, the single cavity 760 shown in FIG. 7 for an opto-coupler 700 may be adapted to be applied onto an encoder 600 or a proximity sensor 500, which has different functionality. In other words, the features and the design shown in each embodiment may be adapted to be applied in a different device shown in another embodiment. Four types of optical devices are shown, i.e. a light-emitting device, 200 shown in FIGS. 2A-2G, a proximity sensor 500 in FIG. 5, an optical encoder 600 shown in FIG. 6, an opto-coupler 700 shown in FIG. 8. However, the invention illustrated that various embodiments may be applied to any other optical devices, optical sensors without deviating from the spirit of invention. The scope of the invention is to be defined by the claims appended hereto and their equivalents. Similarly, manufacturing embodiments and the steps thereof may be altered, combined, reordered, or other such modification as is known in the art to produce the results illustrated.

What is claimed is:

1. An encoder having a code wheel and a package, the package, comprising:
    a plurality of conductors;
    two die attach areas formed separately on two portions of the plurality of conductors;
    a light source die attached on one of the two die attach areas, the light source die configured to emit light towards the code wheel and being reflected thereof;
    a light detector die attached to an other of the two die attach areas for receiving light reflected from the code wheel;
    a body encapsulating a portion of the plurality of conductors, the body having a top surface, a bottom surface and side surfaces through which the plurality of conductors protrudes;
    a first cavity in the body extending from the bottom surface to the top surface of the body and defining therein an opening at each of the top and bottom surfaces of the body;
    a transparent encapsulant of first material formed within the cavity encapsulating the light source die and the die attach area, the cavity having a configuration such that the transparent encapsulant of the first material mechanically interlocks with the body after formation of the first material; and
    an optical lens formed by a portion of the transparent encapsulant of the first material extending from the cavity.

2. The optical device of claim 1, wherein one of the two portions of the plurality of conductors defines a cup shape configured to direct the light emitted from the light source die towards the top surface.

3. The optical device of claim 1, wherein the first cavity extends vertically from the bottom surface to the top surface.

4. The optical device of claim 1, wherein the body comprises at least an internal wall configured to direct light toward the top surface of the body.

5. The optical device of claim 1, wherein the transparent encapsulant is formed by injecting a liquid form encapsulant through the opening of the bottom surface followed by a curing process to solid form.

6. The optical device of claim 5, wherein the transparent encapsulant defines a dome shape configured to direct the light emitted from the light source die.

7. The optical device of claim 1, wherein the light detector die is located in a second cavity.

8. The optical device of claim 7, wherein the first cavity and the second cavity are interconnected.

9. The optical device of claim 7, wherein the bottom surface further defines a second opening interconnected to the second cavity.

10. The optical device of claim 9, wherein a light barrier is located between the light source die and the light detector die.

11. A light source packaging, comprising:
    a plurality of conductors;
    a die attach area formed on at least one of the plurality of conductors;
    a light source die attached on the die attach area, wherein the light source die is configured to emit light;
    a body encapsulating a portion of the plurality of conductors, the body having a top surface, a bottom surface and side surfaces through which the plurality of conductors protrudes;
    a cavity in the body extending from the bottom surface to the top surface of the body defining one opening in the top surface and at least two openings in the bottom surface of the body;
    a transparent encapsulant of first material formed within the cavity encapsulating the light source die and the die attach area, the cavity having a configuration such that the transparent encapsulant of the first material mechanically interlocks with the body after formation of the first material, wherein a portion of the transparent encapsulant of the first material extends from the cavity to form a lens.

12. The optical device of claim 11, wherein at least one of the plurality of conductors defines a cup shape configured to direct the light emitted from the light source die towards the top surface.

13. The optical device of claim 11, wherein the cavity extends vertically from the bottom surface to the top surface.

14. The optical device of claim 11, wherein the body comprises at least an internal wall configured to direct light toward the top surface of the body.

15. The optical device of claim 11, wherein the optical device further comprises an other cavity extending from the bottom surface to the top surface of the body.

16. The optical device of claim 15, wherein the first cavity and the second cavity are interconnected.

17. The optical device of claim 15, wherein the second opening is interconnected to the second cavity.

18. The optical device of claim 11, wherein a receiver die is located in the other cavity.

19. The optical device of claim 11, wherein a light barrier is located between the light source die and the receiver die.

* * * * *